United States Patent
Kodera et al.

(10) Patent No.: US 10,174,428 B2
(45) Date of Patent: Jan. 8, 2019

(54) ETCHANT, REPLENISHMENT SOLUTION AND METHOD FOR FORMING COPPER WIRING

(71) Applicant: MEC COMPANY LTD., Hyogo (JP)

(72) Inventors: Hirofumi Kodera, Hyogo (JP); Ikuyo Katayama, Hyogo (JP); Shota Hishikawa, Hyogo (JP)

(73) Assignee: MEC Company Ltd., Hyogo (JP)

( * ) Notice: Subject to any disclaimer, the term of this patent is extended or adjusted under 35 U.S.C. 154(b) by 95 days.

(21) Appl. No.: 15/124,018

(22) PCT Filed: May 31, 2016

(86) PCT No.: PCT/JP2016/066014
§ 371 (c)(1),
(2) Date: Sep. 6, 2016

(87) PCT Pub. No.: WO2017/038175
PCT Pub. Date: Mar. 9, 2017

(65) Prior Publication Data
US 2017/0260632 A1    Sep. 14, 2017

(30) Foreign Application Priority Data

Aug. 31, 2015 (JP) ................. 2015-170227

(51) Int. Cl.
*C23F 1/18* (2006.01)
*C09K 13/06* (2006.01)
*H05K 3/06* (2006.01)

(52) U.S. Cl.
CPC ............ *C23F 1/18* (2013.01); *C09K 13/06* (2013.01); *H05K 3/067* (2013.01); *H05K 2203/0789* (2013.01)

(58) Field of Classification Search
CPC ....................................................... C23F 1/18
See application file for complete search history.

(56) References Cited

U.S. PATENT DOCUMENTS 3,936,332 A    2/1976  Matsumoto et al.
5,700,389 A *  12/1997 Nakagawa ............... C23F 1/18
                                                    216/105

(Continued)

FOREIGN PATENT DOCUMENTS

CN    85106153 A    3/1987
CN    103898508 A   7/2014

(Continued)

OTHER PUBLICATIONS

Office Action in Corresponding Japanese patent application No. 2016-168139, dated Jul. 25, 2017.

(Continued)

*Primary Examiner* — Roberts P Culbert
(74) *Attorney, Agent, or Firm* — Procopio Cory Hargreaves and Savitch LLP

(57) ABSTRACT

An etchant for copper includes an acid and one or more compounds selected from the group consisting of an aliphatic noncyclic compound, an aliphatic heterocyclic compound and a heteroaromatic compound. The aliphatic noncyclic compound is a saturated aliphatic noncyclic compound (A) including only two or more nitrogen atoms as heteroatoms, and 2 to 10 carbon atoms. The aliphatic heterocyclic compound is a compound (B) including a five-, six-, or seven-membered ring having one or more nitrogen atoms as one or more heteroatoms constituting the ring. The heteroaromatic compound is a compound (C) including a six-membered heteroaromatic ring having one or more nitrogen atoms as one or more heteroatoms constituting the ring.

9 Claims, 1 Drawing Sheet

(56) References Cited

U.S. PATENT DOCUMENTS

| | | |
|---|---|---|
| 6,426,020 B1 | 7/2002 | Okada et al. |
| 2005/0016961 A1 | 1/2005 | Toda et al. |

FOREIGN PATENT DOCUMENTS

| | | |
|---|---|---|
| CN | 104769159 A | 7/2015 |
| JP | 50079448 | 6/1975 |
| JP | H06051453 A | 3/1994 |
| JP | 2001200380 A | 7/2001 |
| JP | 2004256901 A | 9/2004 |
| JP | 2005330572 A | 12/2005 |
| JP | 2006111933 A | 4/2006 |
| JP | 2013104104 A | 5/2013 |
| JP | 2013527323 A | 6/2013 |
| JP | 5618340 B1 | 11/2014 |
| JP | 2014224303 A | 12/2014 |
| JP | 2015007271 A | 1/2015 |
| JP | 2015129342 A | 7/2015 |
| WO | 2011147448 A1 | 12/2011 |
| WO | 2014171034 A1 | 10/2014 |
| WO | 2014171174 A1 | 10/2014 |
| WO | 2015083570 A1 | 6/2015 |

OTHER PUBLICATIONS

Office Action in Corresponding Japanese patent application No. 2016-168140, dated Jul. 25, 2017.
International Search Report issued in related PCT Application No. PCT/JP2016/066014, dated Jul. 5, 2016, 2 pages.
Decision to Grant a Patent issued in related Japanese Patent Application No. 2015-170227, dated Jul. 29, 2016, 6 pages.
Notification of Reasons for Refusal issued in related Japanese Patent Application No. 2015-170227, dated Jun. 23, 2016, 4 pages.
Chinese Office Action issued in corresponding CN Application No. 201680000623.3, dated Jan. 17, 2018.

\* cited by examiner

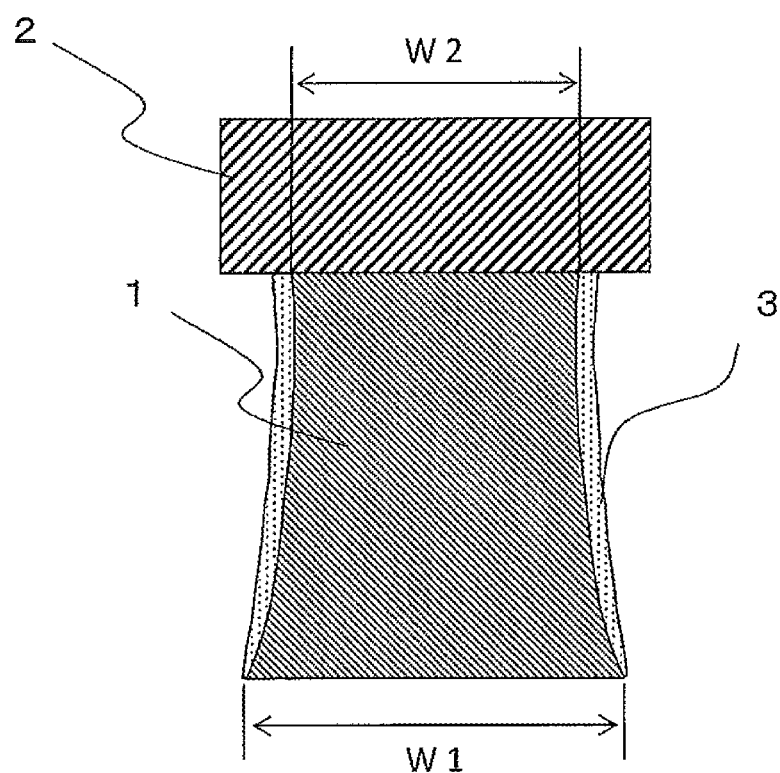

ETCHANT, REPLENISHMENT SOLUTION AND METHOD FOR FORMING COPPER WIRING

BACKGROUND OF THE INVENTION

Field of the Invention

The present invention relates to an etchant for copper, a replenishment solution therefor, and a method for forming copper wiring.

Description of the Related Art

When a photoetching method is used to form a copper wiring pattern in the production of a printed wiring board, for example, an iron chloride-based etchant, a copper chloride-based etchant or an alkaline etchant is used as an etchant. The use of these etchants may cause copper below the etching resist to be dissolved from side surfaces of the wiring pattern, this phenomenon being called side etching. In other words, there is caused a phenomenon that a portion of copper which is covered with the etching resist to be desired not to be primarily removed by the etching (i.e., a copper wiring portion) is removed by the etchant, so that the copper wiring is made narrower from the bottom of the copper wiring toward the top thereof. In particular, when the copper wiring pattern is fine, it is essential to decrease such side etching as much as possible. In order to restrain this side etching, Patent Document 1 suggests an etchant into which an azole compound that is a five-membered heteroaromatic compound is incorporated.

The etchant described in Patent Document 1 makes it possible to restrain side etching. However, the use of the etchant described in Patent Document 1 in a usual way may unfavorably cause side surfaces of copper wiring to be uneven. When a side surface of the copper wiring is uneven, the copper wiring is lowered in linearity (wiring width ($W2$) of the top of the copper wiring) (see FIG. 1). Consequently, when the copper wiring width is optically examined from above the printed wiring board, misrecognition may be unfavorably caused. Moreover, when the linearity is extremely deteriorated, the printed wiring board may be lowered in impedance characteristic. Thus, Patent Document 2 suggests an etchant including a specific aliphatic heterocyclic compound and not to cause lowering in the linearity of copper wiring easily.

Patent Document 3 discloses a composition which is used for micro-etching for promoting the adhesion of an imaging resist or a solder mask onto a surface of copper or a copper alloy, and which includes a halide ion source, such as a bromide ion. However, this composition is not an etchant used to form copper wiring.

PRIOR ART DOCUMENTS

Patent Documents

Patent Document 1: JP-A-2005-330572
Patent Document 2: Japanese Patent No. 5618340
Patent Document 3: JP-A-2013-527323

SUMMARY OF THE INVENTION

Etchants are required to restrain side etching as described above and restrain copper wiring from being lowered in linearity, and further to restrain a variation in the wiring width ($W1$) (see FIG. 1) of the bottom of any copper wiring after etching. The variation in the wiring width ($W1$) of the bottom of the copper wiring damages the reliability of electrical insulation between the copper wiring and another copper wiring adjacent thereto to result in lowering in the yield. Moreover, when the variation in the wiring width of the copper wiring bottom is extremely large, the printed wiring board may be unfavorably lowered in impedance characteristic.

In light of the above-mentioned actual situation, the present invention has been made. An object thereof is to provide an etchant capable of restraining side etching without lowering the linearity of copper wiring, and capable of restraining a variation in the wiring width ($W1$) of the bottom of the copper wiring; a replenishment solution therefor; and a method for forming copper wiring.

The present invention relates to an etchant for copper, which is an aqueous solution including an acid, an oxidizing metal ion, a bromide ion, and one or more compounds selected from the group consisting of an aliphatic noncyclic compound, an aliphatic heterocyclic compound and a heteroaromatic compound, wherein the aliphatic noncyclic compound is a saturated aliphatic noncyclic compound (A) including only two or more nitrogen atoms as heteroatoms, and 2 to 10 carbon atoms, the aliphatic heterocyclic compound is an aliphatic heterocyclic compound (B) including a five-, six-, or seven-membered ring having one or more nitrogen atoms as one or more heteroatoms constituting the ring, and the heteroaromatic compound is a heteroaromatic compound (C) including a six-membered heteroaromatic ring having one or more nitrogen atoms as one or more heteroatoms constituting the ring.

The present invention also relates to a replenishment solution which is added, at the time of using the above-mentioned etchant continuously or repeatedly, to the etchant. This replenishment solution is an aqueous solution including one or more compounds selected from the group consisting of an aliphatic noncyclic compound, an aliphatic heterocyclic compound and a heteroaromatic compound, wherein the aliphatic noncyclic compound is a saturated aliphatic noncyclic compound (A) including only two or more nitrogen atoms as heteroatoms, and 2 to 10 carbon atoms, the aliphatic heterocyclic compound is an aliphatic heterocyclic compound (B) including a five-, six-, or seven-membered ring having one or more nitrogen atoms as one or more heteroatoms constituting the ring, and the heteroaromatic compound is a heteroaromatic compound (C) including a six-membered heteroaromatic ring having one or more nitrogen atoms as one or more heteroatoms constituting the ring.

The present invention also relates to a method for forming copper wiring by etching a portion of a copper layer that is uncovered with an etching resist, wherein the etching is performed using the above-mentioned etchant.

In the present invention, "copper" may be a substance made of copper, or a substance made of any copper alloy. In the present specification, the word "copper" denotes copper or any copper alloy.

The present invention makes it possible to provide an etchant capable of restraining side etching without lowering the linearity of copper wiring, and capable of restraining a variation in the wiring width ($W1$) of the bottom of the copper wiring after etching; a replenishment solution therefor; and a method for forming copper wiring.

BRIEF DESCRIPTION OF THE DRAWING

FIG. 1 is a sectional view illustrating an example of copper wiring after etching with an etchant of the present invention.

DETAILED DESCRIPTION OF THE PREFERRED EMBODIMENT

<Etchant for Copper>

The etchant of the present invention for copper is an aqueous solution including an acid, an oxidizing metal ion, a bromide ion, and one or more compounds selected from the group consisting of an aliphatic noncyclic compound, an aliphatic heterocyclic compound and a heteroaromatic compound. The aliphatic noncyclic compound is a saturated aliphatic noncyclic compound (A) including only two or more nitrogen atoms as heteroatoms, and 2 to 10 carbon atoms. The aliphatic heterocyclic compound is an aliphatic heterocyclic compound (B) including a five-, six-, or seven-membered ring having one or more nitrogen atoms as one or more heteroatoms constituting the ring. The heteroaromatic compound is a heteroaromatic compound (C) including a six-membered heteroaromatic ring having one or more nitrogen atoms as one or more heteroatoms constituting the ring.

FIG. 1 is a sectional view illustrating an example of copper wiring after etching with an etchant of the present invention. An etching resist 2 is formed on copper wiring 1. A protective coat 3 is formed on any side surface of the copper wiring 1 that is positioned just below any edge of the etching resist 2. According to the formation of copper wiring using an ordinary copper chloride-based etchant or iron chloride-based etchant, a cuprous ion and a salt thereof are produced as the etching advances. Fractions of the etchant are exchanged slowly between wires. Thus, it gradually becomes more difficult for, particularly, fine wires to be vertically etched by effect of the cuprous ion and the salt thereof. Consequently, side etching of the wires is significant.

It is considered that: with use of the etchant of the present invention, the one or more compounds, which are selected from the group consisting of the aliphatic noncyclic compound, the aliphatic heterocyclic compound and the heteroaromatic compound, capture a cuprous ion and a salt thereof that are produced with the advance of etching, thereby advancing the etching rapidly in a vertical direction; and simultaneously on any side surface of the copper wiring 1, which is not directly affected with ease by an impact of the spray, the protective coat 3 is uniformly formed, this coat 3 being made from the cuprous ion and the salt thereof, and the one or more compounds, which are selected from the group consisting of the aliphatic noncyclic compound, the aliphatic heterocyclic compound and the heteroaromatic compound. Since the protective coat 3 made from the one or more compounds, which are selected from the group consisting of the aliphatic noncyclic compound, the aliphatic heterocyclic compound and the heteroaromatic compound, is uniform, it is considered that side etching is restrained without lowering the linearity of the copper wiring 1.

Furthermore, with use of the etchant of the present invention, the bromide ion makes the protective coat 3 more strong, and further this coat 3 is uniformly formed down to the bottom of the copper wiring. It can be therefore considered that the side etching can be further restrained, and further the wiring width of the bottom of the copper wiring can be restrained from being varied after the etching.

Thus, the etchant of the present invention can improve the yield of printed wiring boards in the production process of the boards. The protective coat 3 can easily be removed by treatment with a removing liquid after the etching treatment. The removing liquid is preferably, for example, an aqueous acidic solution, such as a dilute hydrochloric acid solution in water, or a dilute sulfuric acid solution in water.

<Acid>

The acid used in the etchant of the present invention is appropriately selectable from inorganic acids and organic acids. Examples of the inorganic acids include sulfuric acid, hydrochloric acid, nitric acid and phosphoric acid (here, hydrobromic acid is excluded from the acids). Examples of the organic acids include formic acid, acetic acid, oxalic acid, maleic acid, benzoic acid, and glycolic acid. Out of these acids, hydrochloric acid is preferred from the viewpoint of the stability of the etching speed and the dissolution stability of copper.

The concentration of the acid is preferably from 5 to 180 g/L, more preferably from 7 to 150 g/L. When the concentration of the acid is 5 g/L or more, the etching speed is high, so that copper can be rapidly etched. When the concentration of the acid is 180 g/L or less, the dissolution stability of copper is maintained, and further the working environment can be restrained from being deteriorated.

<Oxidizing Metal Ion>

It is sufficient for the oxidizing metal ion used in the etchant of the present invention to be a metal ion capable of oxidizing metallic copper. Examples thereof include a cupric ion and a ferric ion. It is preferred from the viewpoint of restraint of side etching and the stability of the etching speed to use a cupric ion as the oxidizing metal ion.

The oxidizing metal ion can be incorporated into the etchant by blending an oxidizing metal ion source in the etchant. When, for example, a cupric ion source is used as the oxidizing metal ion source, specific examples thereof include copper chloride, copper sulfate, copper bromide, copper salts of organic acids, and copper hydroxide. When, for example, a ferric ion source is used as the oxidizing metal ion source, specific examples thereof include iron chloride, iron bromide, iron iodide, iron sulfate, iron nitrate, and iron salts of organic acids.

The concentration of the oxidizing metal ion is preferably from 10 to 300 g/L, more preferably from 10 to 250 g/L, even more preferably from 15 to 220 g/L, even more preferably from 30 to 200 g/L. When the concentration of the oxidizing metal ion is 10 g/L or more, the etching speed is high, so that copper can be rapidly etched. When the concentration of the oxidizing metal ion is 300 g/L or less, the dissolution stability of copper is maintained.

<Bromide Ion>

The bromide ion used in the etchant of the present invention can be incorporated into the etchant by blending a bromide ion source in the etchant. Examples of the source include hydrobromic acid, sodium bromide, potassium bromide, lithium bromide, magnesium bromide, calcium bromide, barium bromide, copper bromide, zinc bromide, ammonium bromide, silver bromide, and bromine. Hydrobromic acid, sodium bromide and potassium bromide are preferred since these sources make it possible to restrain the wiring width (W1) of the copper wiring bottom more largely from being varied after the etching.

The concentration of the bromide ion is preferably from 10 to 150 g/L, more preferably from 20 to 120 g/L, even more preferably from 30 to 110 g/L. When the concentration of the bromide ion is 10 g/L or more, side etching can be effectively restrained. When the concentration of the bromide ion is 150 g/L or less, the wiring width (W1) of the copper wiring bottom can be effectively restrained from being varied after the etching.

One or more compounds selected from the group consisting of an aliphatic noncyclic compound, an aliphatic heterocyclic compound and a heteroaromatic compound are blended in the etchant of the present invention to restrain side etching without lowering the linearity of copper wiring.

<Aliphatic Noncyclic Compound>

The aliphatic noncyclic compound in the present invention is a saturated aliphatic noncyclic compound (A) including only two or more nitrogen atoms as heteroatoms, and 2 to 10 carbon atoms. The aliphatic noncyclic compound has a linear or branched chain structure. At least one terminal group of the aliphatic noncyclic compound (A) is preferably a $NH_2$ group from the viewpoint of the structural stability of this compound and the solubility thereof in an acid liquid. The number of carbon atoms in the aliphatic noncyclic compound (A) is preferably from 2 to 9, more preferably from 2 to 8, even more preferably from 2 to 7 from the viewpoint of the structural stability of this compound and the solubility thereof in an acid liquid. One or more of these aliphatic noncyclic compounds can be blended in the etchant of the present invention.

Examples of the aliphatic noncyclic compound (A) include 1,3-diaminopropane, 1,2-diaminopropane, N,N-bis(3-aminopropyl)methylamine, 2-diethylaminoethylamine, 2,2'-diamino-N-methyldiethylamine, 1,6-diaminohexane, 1,4-diaminobutane, 1,7-diaminoheptane, 1,10-diaminodecane, ethylenediamine, diethylenetriamine, triethylenetetramine, tetraethylenepentamine, pentaethylenehexamine, and 3,6,9,12,15-pentaazaheptadecane-1,17-diamine. The aliphatic noncyclic compound (A) is preferably diethylenetriamine, triethylenetetramine, tetraethylpentamine or pentaethylenehexamine to restrain side etching further with more sufficient restraint of lowering in the linearity of copper wiring.

<Aliphatic Heterocyclic Compound>

The aliphatic heterocyclic compound in the present invention is an aliphatic heterocyclic compound (B) including a five-, six-, or seven-membered ring having one or more nitrogen atoms as one or more heteroatoms constituting the ring. Specific examples of the aliphatic heterocyclic compound include any pyrrolidine compound having a pyrrolidine skeleton, any piperidine compound having a piperidine skeleton, any piperazine compound having a piperazine skeleton, any homopiperazine compound having a homopiperazine skeleton, and any hexahydro-1,3,5-triazine compound having a hexahydro-1,3,5-triazine skeleton. About these listed-up compounds, their aliphatic hetero ring may be substituted with a substituent such as an amino, alkyl, aralkyl, aryl, nitro, nitroso, hydroxyl, carboxyl, carbonyl, alkoxy, halogen, azo, cyano, imino, phosphino, thiol or sulfo group or radical. One or more of these aliphatic heterocyclic compounds may be blended in the etchant of the present invention.

The aliphatic heterocyclic compound (B) is preferably an aliphatic heterocyclic compound (b1) including a five-, six-, or seven-membered ring having only one or more nitrogen atoms as one or more heteroatoms constituting the ring in order to restrain side etching without lowering the linearity of copper wiring.

Since the compound (b1) is an aliphatic heterocyclic compound including a five-, six-, or seven-membered ring having only one or more nitrogen atoms as one or more heteroatoms constituting the ring, this compound is high in structural stability and solubility in an acidic liquid.

The compound (b1) is selectable from aliphatic heterocyclic compounds each including a five-, six-, or seven-membered ring having only one or more nitrogen atoms as one or more heteroatoms constituting the ring. The compound (b1) is preferably an aliphatic heterocyclic compound in which the number of nitrogen atoms constituting its ring is 3 or less from the viewpoint of the stability in the etchant.

From the viewpoint of improving the linearity of copper wiring and restraining side etching effectively, it is particularly preferred to incorporate, as the compound (b1), one or more selected from pyrrolidine compounds, piperidine compounds, piperazine compounds, homopiperazine compounds, and hexahydro-1,3,5-triazine compounds.

The pyrrolidine compounds are not particularly limited as far as the compounds are each a compound having a pyrrolidine skeleton. The pyrrolidine compounds are, for example, pyrrolidine compounds each represented by the following formula (I):

[Formula]

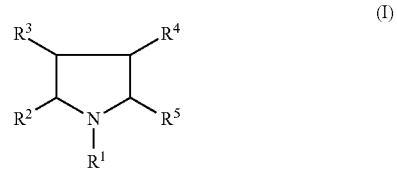

wherein $R^1$ to $R^5$ each independently represent hydrogen, an amino group-containing substituent, or a hydrocarbon derivation group which is other than any amino group-containing substituent and has 1 to 10 carbon atoms; and these substituents may be bonded to one another to form a cyclic structure.

The amino group denotes any one of $-NH_2$, $-NHR$, and $-NRR'$. The groups Rs and R' each independently represent a hydrocarbon derivation group having 1 to 10 carbon atoms; and R' and R may be bonded to each other to form a saturated cyclic structure. The amino group-containing substituent denotes any one of substituents each made of an amino group, and substituents in each of which hydrogen atoms of a hydrocarbon derivation group having 1 to 10 carbon atoms are partially substituted with one or more amino groups. From the viewpoint of restraining side etching effectively and improving the linearity of copper wiring further, it is preferred that the amino group-containing substituent is a substituent made of an amino group, or an amino group-containing substituent made of carbon, hydrogen and nitrogen. The same matters are applicable to any amino group and any amino group-containing substituent that will be described hereinafter.

The hydrocarbon derivation group denotes a hydrocarbon group in which carbon or hydrogen atoms may be partially substituted with one or more other atoms or one or more substituents. Examples of the hydrocarbon derivation group include methyl, ethyl, propyl, butyl, hydroxymethyl, hydroxyethyl, hydroxypropyl, allyl, acetyl, phenyl, hydroxyethoxymethyl, hydroxyethoxyethyl, and hydroxyethoxypropyl groups. The hydrocarbon derivation group is preferably a hydrocarbon derivation group made of carbon and hydrogen to restrain side etching effectively and improve the linearity of copper wiring further. The same matters are applicable to any hydrocarbon derivation group that will be described hereinafter.

Specific examples of the pyrrolidine compounds include pyrrolidine, 1-methylpyrimidine, 2-pyrrolidone, 1-(2-hydroxyethyl)pyrrolidine, indoline, 1-isopropyl-3-hydroxypyrrolidine, 1,2-cyclohexanedicarboxyimide, 1-butylpyrrolidine, 1-ethylpyrrolidine, 2-(2-hydroxyethyl)-1-methylpyrrolidine, 2-methylpyrrolidine, 1-(2-hydroxyethyl)

pyrrolidine, 1-(3-aminopropyl)pyrrolidine, 1-(2-aminoethyl)pyrrolidine, 3-aminopyrrolidine, 2-aminomethyl-1-ethylpyrrolidine, 2-(2-aminoethyl)-1-methylpyrrolidine, 3-(dimethylamino)pyrrolidine, 3-(methylamino)pyrrolidine, 1-(2-pyrrolidinylmethyl)pyrrolidine, 3-(diethylamino)pyrrolidine, 1,1'-dimethyl-3-aminopyrrolidine, 3-(ethylamino)pyrrolidine, 1-methyl-2-(1-piperidinomethyl)pyrrolidine, 4-(1-pyrrolidinyl)piperidine, 3-(N-acetyl-N-methylamino)pyrrolidine, 3-(N-acetyl-N-ethylamino)pyrrolidine, 2-pyrrolidinecarboxamide, 3-pyrrolidinecarboxamide, 3-acetamidopyrrolidine, 1-ethyl-2-pyrrolidinecarboxamide, 3-(amino-1-tert-butoxycarbonyl)pyrrolidine, 3-(tert-butoxycarbonylamino)pyrrolidine, 1-amino-2-(methoxymethyl)pyrrolidine, 1-benzyl-3-aminopyrrolidine, 1-benzyl-3-(dimethylamino)pyrrolidine, 1-benzyl-3-(methylamino)pyrrolidine, 1-benzyl-3-(ethylamino)pyrrolidine, 3,4-diamino-1-benzylpyrrolidine, 1-benzyl-3-acetamidopyrrolidine, and (1s,6s)-2,8-diazabicyclo[4.3.0]nonane.

The above-mentioned piperidine compounds are not particularly limited as far as the compounds are each a compound having a piperidine skeleton. The piperidine compounds are, for example, piperidine compounds each represented by the following formula (II):

[Formula]

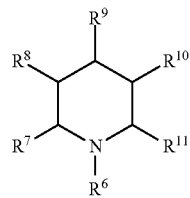

(II)

wherein $R^6$ to $R^{11}$ each independently represent hydrogen, an amino group-containing substituent, or a hydrocarbon derivation group which is other than any amino group-containing substituent and has 1 to 10 carbon atoms; and these substituents may be bonded to one another to form a cyclic structure.

Specific examples of the piperidine compounds include piperidine, 2-piperidone, 1-methylpiperidine, 2-methylpiperidine, 3-methylpiperidine, 4-methylpiperidine, 3,5-dimethylpiperidine, 2-ethylpiperidine, 4-piperidinecarboxylic acid, 1,2,3,4-tetrahydroquinoline, decahydroisoquinoline, 2,6-dimethylpiperidine, 2-piperidinemethanol, 3-piperidinemethanol, 4-piperidinemethanol, 2,2,6,6-tetramethylpiperidine, 4-aminopiperidine, 1-aminopiperidine, 3-aminopiperidine, 4-(aminomethyl)piperidine, 4-amino-1-methylpiperidine, 2-(aminomethyl)piperidine, 3-(aminomethyl)piperidine, 4-piperidinecarboxamide, 2-piperidinecarboxamide, 1-(2-aminoethyl)piperidine, 4-acetamidopiperidine, 3-acetamidopiperidine, 4-amino-1-isopropylpiperidine, 1-(3-aminopropyl)-2-methylpiperidine, 4-amino-2,2,6,6-tetramethylpiperidine, 2,2'-bipiperidine, 4,4'-bipiperidine, 4-piperidinopiperidine, ethyl 4-amino-1-piperidinecarboxylate, 4-amino-1-benzylpiperidine, 4-(2-aminoethyl)-1-benzylpiperidine, 4-acetamide-1-benzylpiperidine, and 3-aminoquinuclidine.

The above-mentioned piperazine compounds are not particularly limited as far as the compounds are each a compound having a piperazine skeleton. The compounds are, for example, piperazine compounds each represented by the following formula (III):

[Formula]

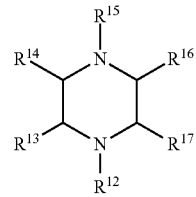

(III)

wherein $R^{12}$ to $R^{17}$ each independently represent hydrogen, an amino group-containing substituent, or a hydrocarbon derivation group which is other than any amino group-containing substituent and has 1 to 10 carbon atoms; and these substituents may be bonded to one another to form a cyclic structure.

Specific examples of the piperazine compounds include piperazine, 1-methylpiperazine, 2-methylpiperazine, 1-allylpiperazine, 1-isobutylpiperazine, 1-hydroxyethoxyethylpiperazine, 1-phenylpiperazine, 1-aminoethylpiperazine, 1-amino-4-methylpiperazine, 1-ethylpiperazine, 1-piperazineethanol, ethyl 1-piperazinecarboxylate, 1-formylpiperazine, 1-propylpiperazine, 1-acetylpiperazine, 1-isopropylpiperazine, 1-cyclopentylpiperazine, 1-cyclohexylpiperazine, 1-(2-methoxyethyl)piperazine, 1-piperonylpiperazine, 1-(diphenylmethyl)piperazine, 2-piperazinone, 1,4-dimethylpiperazine, 1-methyl-3-phenylpiperazine, 1,4-bis(3-aminopropyl)piperazine, 1-(2-dimethylaminoethyl)-4-methylpiperazine, 1-(2-aminoethyl)piperazine, 1,4-bis(3-aminopropyl)piperazine, 2,5-dimethylpiperazine, 2,6-dimethylpiperazine, 1,4-diformylpiperazine, 1-(4-aminophenyl)-4-methylpiperazine, 1,4-diacetyl-2,5-piperazinedione, 1-methyl-4-(1,4'-bipiperidine-4-yl)piperazine, 1-(4-aminophenyl)-4-(4-methoxyphenyl)piperazine, 1,4-dimethylpiperazine-2-one, 1,4-diethylpiperazine-2-one, 1,4-dimethylpiperazine-2,3-dione, 2-piperazinecarboxylic acid, and triethylenediamine.

The above-mentioned homopiperazine compounds are not particularly limited as far as the compounds are each a compound having a homopiperazine skeleton. The compounds are, for example, homopiperazine compounds each represented by the following formula (IV):

[Formula]

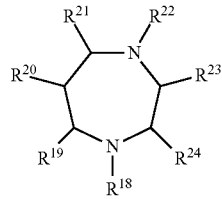

(IV)

wherein $R^{18}$ to $R^{24}$ each independently represent hydrogen, an amino group-containing substituent, or a hydrocarbon derivation group which is other than any amino group-containing substituent and has 1 to 10 carbon atoms; and these substituents may be bonded to one another to form a cyclic structure.

Specific examples of the homopiperazine compounds include homopiperazine, 1-methylhomopiperazine, 1-formylhomopiperazine, 1,4-dimethylhomopiperazine, 4-methyl-1-homopiperazinedithiocarboxylic acid, 1-acetylhomopiperazine, and 1-butyrylhomopiperazine.

The above-mentioned hexahydro-1,3,5-triazine compounds are not particularly limited as far as the compounds are each a compound having a hexahydro-1,3,5-triazine skeleton. The compounds are, for example, hexahydro-1,3,5-triazine compounds each represented by the following formula (V):

[Formula]

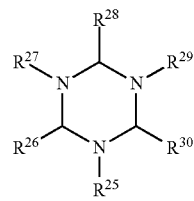

(V)

wherein $R^{25}$ to $R^{30}$ each independently represent hydrogen, an amino group-containing substituent, or a hydrocarbon derivation group which is other than any amino group-containing substituent and has 1 to 10 carbon atoms; and these substituents may be bonded to one another to form a cyclic structure.

Specific examples of the hexahydro-1,3,5-triazine compounds include hexahydro-1,3,5-triazine, hexahydro-1,3,5-trimethyl-1,3,5-triazine, hexahydro-2,4,6-trimethyl-1,3,5-triazine, hexahydro-1,3,5-tris(3-dimethylaminopropyl)-1,3,5-triazine, hexahydro-1,3,5-tripropyl-1,3,5-triazine, hexahydro-1,3,5-triethyl-1,3,5-triazine, hexahydro-1,3,5-triisopropyl-1,3,5-triazine, hexahydro-1,3,5-tribenzyl-1,3,5-triazine, hexahydro-1,3,5-tris(2-hydroxyethyl)-1,3,5-triazine, hexahydro-1,3,5-trinitro-1,3,5-triazine, hexahydro-1,3,5-trinitroso-1,3,5-triazine, hexahydro-2,4,6-trimethyl-1,3,5-trinitro-1,3,5-triazine, hexahydro-1,3,5-triacryloyl-1,3,5-triazine, and hexamethylenetetramine.

The above-mentioned compound (b1) is preferably 1-methylpiperazine, 1-aminoethylpiperazine, or 1,4-bis(3-aminopropyl)piperazine to restrain side etching further with more sufficient restraint of lowering in the linearity of copper wiring.

<Heteroaromatic Compound>

The heteroaromatic compound in the present invention is a heteroaromatic compound (C) including a six-membered heteroaromatic ring having one or more nitrogen atoms as one or more heteroatoms constituting the ring. The six-membered heteroaromatic compound is preferably a compound having, as one or more heteroatoms constituting its ring, only one or more nitrogen atoms from the viewpoint of the structural stability of this compound and the solubility thereof in an acidic liquid. Examples of the heteroaromatic compounds include pyridine compounds each substituted with an amino group-containing substituent, pyrimidine compounds, pyrazine compounds, pyridazine compounds, and 1,3,5-triazine compounds. Their heteroaromatic ring may be substituted with a substituent, such as an amino group-containing substituent or an alkyl, aralkyl, aryl, nitro, nitroso, hydroxyl, carboxyl, carbonyl, alkoxy, halogen, azo, cyano, imino, phosphino, thiol or sulfo group or radical. One or more of these six-membered heteroaromatic compounds may be blended in the etchant of the present invention.

The above-mentioned pyridine compounds, which are each substituted with an amino group-containing substituent, are not particularly limited as far as the compounds are each a compound having a pyridine ring and substituted with an amino group-containing substituent. The compounds are, for example, pyridine compounds each represented by the following formula (VI):

[Formula]

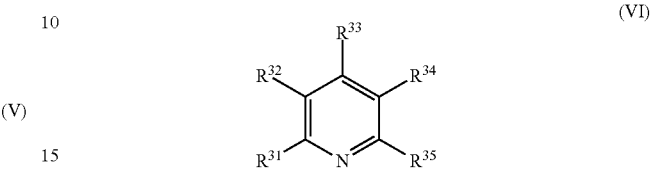

wherein $R^{31}$ to $R^{35}$ each independently represent hydrogen, an amino group-containing substituent, or a hydrocarbon derivation group which is other than any amino group-containing substituent and has 1 to 10 carbon atoms, provided that at least one of $R^{31}$ to $R^{35}$ represents the amino group-containing substituent; and these substituents may be bonded to one another to form a cyclic structure.

Specific examples of the pyridine compounds, which are each substituted with an amino group-containing substituent, include 3-aminopyridine, 2-aminopyridine, 4-aminopyridine, 2-amino-3-methylpyridine, 2-amino-4-methylpyridine, 2-amino-5-methylpyridine, 2-(aminomethyl)pyridine, 3-amino-4-methylpyridine, 5-amino-2-methylpyridine, 4-amino-3-methylpyridine, 3-amino-2-methylpyridine, 4-amino-2-methylpyridine, 3-amino-5-methylpyridine, 2-(methylamino)pyridine, 4-(methylamino)pyridine, 3-(aminomethyl)pyridine, 4-(aminomethyl)pyridine, 2,3-diaminopyridine, 3,4-diaminopyridine, 2,6-diaminopyridine, 2-amino-5-cyanopyridine, 2-amino-3-cyanopyridine, 2-aminopyridine-3-carboxyaldehyde, pyridine-2-carboxamide, 2-amino-4,6-dimethylpyridine, 4-(2-aminoethyl)pyridine, 3-(2-aminoethyl)pyridine, 2-(2-aminoethyl)pyridine, 4-dimethylaminopyridine, 2-dimethylaminopyridine, 2-(ethylamino)pyridine, 2-amino-3-(hydroxymethyl)pyridine, 4-acetamidopyridine, 2-acetamidopyridine, 3-acetamidopyridine, 4-(ethylaminomethyl)pyridine, 2-aminoquinoline, 3-aminoquinoline, 5-aminoquinoline, 6-aminoquinoline, 8-aminoquinoline, and 4-dimethylamino-1-neopentylpyridinium chloride.

The above-mentioned pyrimidine compounds are not particularly limited as far as the compounds are each a compound having a pyrimidine ring. The compounds are, for example, pyrimidine compounds each represented by the following formula (VII):

[Formula]

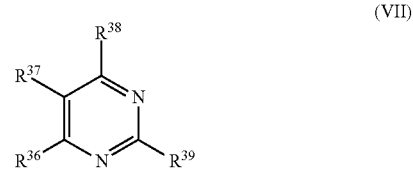

wherein $R^{36}$ to $R^{39}$ each independently represent hydrogen, an amino group-containing substituent, or a hydrocarbon derivation group which is other than any amino group-containing substituent and has 1 to 10 carbon atoms; and these substituents may be bonded to one another to form a cyclic structure.

Specific examples of the pyrimidine compounds include pyrimidine, 4-methylpyrimidine, 2-aminopyrimidine, 4-aminopyrimidine, 5-aminopyrimidine, 2-cyanopyrimidine, 4,6-dimethylpyrimidine, 2-amino-4-methylpyrimidine, 2,4-diaminopyrimidine, 4,6-diaminopyrimidine, 4,5-diaminopyrimidine, 4-methoxypyrimidine, 4-amino-6-hydroxypyrimidine, 4,6-dihydropyrimidine, 2-mercaptopyrimidine, 2-chloropyrimidine, 2-amino-4,6-dimethylpyrimidine, 4-amino-2,6-dimethylpyrimidine, pyrimidine-5-carboxylic acid, 4,6-dimethyl-2-hydroxypyridine, 2,4-dimethyl-6-hydroxypyridine, 2-amino-4-hydroxy-6-methylpyridine, 4-amino-6-hydroxy-2-methylpyridine, 2,4,6-triaminopyrimidine, 2,4-diamino-6-hydroxypyrimidine, 4,6-hydroxy-2-methylpyridine, 4,5-diamino-6-hydroxypyrimidine, 2-amino-4,6-dimethylpyrimidine, 2-chloro-4-methylpyrimidine, 4-chloro-2-methylpyrimidine, 2-chloro-5-methylpyrimidine, 2-amino-5-methylpyrimidine, 4-amino-6-chloropyrimidine, 4-amino-2-chloropyrimidine, 5-amino-4-chloropyrimidine, 4-chloro-6-hydroxypyrimidine, methyl pyrimidine-2-carboxylate, 4-amino-2-methyl-5-pyrimidinemethanol, 2-amino-5-nitropyrimidine, 4,6-dimethyl-2-mercaptopyrimidine, 4,6-diamino-2-methylpyrimidine, 2-chloro-5-ethylpyrimidine, 4-amino-2-dimethylamino-6-hydroxypyrimidine, 4,5-pyrimidinediamine, 2-phenylpyrimidine, and quinazoline.

The above-mentioned pyrazine compounds are not particularly limited as far as the compounds are each a compound having a pyrazine ring. The compounds are, for example, pyrazine compounds each represented by the following formula (VIII):

[Formula]

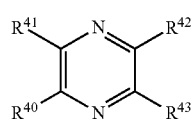

(VIII)

wherein $R^{40}$ to $R^{43}$ each independently represent hydrogen, an amino group-containing substituent, or a hydrocarbon derivation group which is other than any amino group-containing substituent and has 1 to 10 carbon atoms; and these substituents may be bonded to one another to form a cyclic structure.

Specific examples of the pyrazine compounds include pyrazine, 2,5-dimethylpyrazine, 2-methylpyrazine, 2,3-dimethylpyrazine, 2,6-dimethylpyrazine, 2,3,5-trimethylpyrazine, 2,3,5,6-tatramethylpyrazine, 2-cyanopyrazine, 2-tert-butylpyrazine, 2-ethylpyrazine, 2,3-dicyanopyrazine, 2-ethyl-3-methylpyrazine, 2-vinylpyrazine, 2,3-diethylpyrazine, 2,3-dicyano-5-methylpyrazine, 5-ethyl-2,3-dimethylpyrazine, 2-propylpyrazine, 2,3-diethyl-5-methylpyrazine, 2-methyl-3-propylpyrazine, 2-acetylpyrazine, 2-methyl-3-isobutylpyrazine, 2-acetyl-3-methylpyrazine, (2-mercaptoethyl)pyrazine, 2-acetyl-3-ethylpyrazine, pyrazinecarboxylic acid, 5-methylpyrazine-2-carboxylic acid, methyl 2-pyrazinecarboxylate, 2,3-pyrazinedicarboxylic acid, 5-methyl-2,3-cyclopentenopyrazine, 5,6,7,8-tetrahydroquinoxaline, 2-methylquinoxaline, 2,3-dimethylquinoxaline, 2-aminopyrazine, 2-(aminomethyl)-5-methylpyrazine, 5,6-diamino-2,3-dicyanopyrazine, 3-aminopyrazine-2-carboxylic acid, 3-aminocarbonylpyrazine-2-carboxylic acid, and 2-amino-5-phenylpyrazine.

The above-mentioned pyridazine compounds are not particularly limited as far as the compounds are each a compound having a pyridazine ring. The compounds are, for example, pyridazine compounds each represented by the following formula (IX):

[Formula]

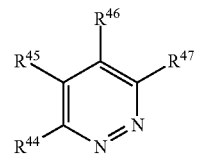

(IX)

wherein $R^{44}$ to $R^{47}$ each independently represent hydrogen, an amino group-containing substituent, or a hydrocarbon derivation group which is other than any amino group-containing substituent and has 1 to 10 carbon atoms; and these substituents may be bonded to one another to form a cyclic structure.

Specific examples of the pyridazine compounds include pyridazine, 2-methylpyridazine, 3-methylpyridazine, 4-methylpyridazine, pyridazine-4-carboxylic acid, 4,5-benzopyridazine, and 3-aminopyridazine.

The above-mentioned 1,3,5-triazine compounds are not particularly limited as far as the compounds are each a compound having a 1,3,5-triazine ring. The compounds are, for example, 1,3,5-triazine compounds each represented by the following formula (X):

[Formula]

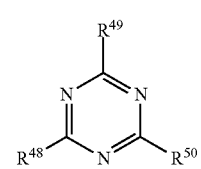

(X)

wherein $R^{48}$ to $R^{50}$ each independently represent hydrogen, an amino group-containing substituent, or a hydrocarbon derivation group which is other than any amino group-containing substituent and has 1 to 10 carbon atoms; and these substituents may be bonded to one another to form a cyclic structure.

Specific examples of the 1,3,5-triazine compounds include 1,3,5-triazine, 2,4-diamino-6-methyl-1,3,5-triazine, 2-methyl-4,6-bis(trichloromethyl)-1,3,5-triazine, 2,4,6-tris(pentafluoroethyl)-1,3,5-triazine, 2,4,6-triphenyl-1,3,5-triazine, 2,4-bis(trichloromethyl)-6-[2-(furan-2-yl)vinyl]-1,3,5-triazine, 4,6-bis(trichloromethyl)-2-(4-methoxyphenyl)-1,3,5-triazine, 2-(4-methoxystyryl)-4,6-bis(trichloromethyl)-1,3,5-triazine, 2-(3,4-dimethoxystyryl)-4,6-bis(trichloromethyl)-1,3,5-triazine, 2,4-bis(trichloromethyl)-6-[2-(furane-2-yl)vinyl]-1,3,5-triazine, 2-(1,3-benzodioxole-5-yl)-4,6-bis(trichloromethyl)-1,3,5-triazine, 2,4,6-tri(4-pyridyl)-1,3,5-triazine, 2,4,6-tris(2-pyridyl)-1,3,5-triazine, 2,4-diamino-1,3,5-triazine, 2,4,6-triamino-1,3,5-triazine, 2,4-diamino-6-dimethylamino-1,3,5-triazine, 2,4-diamino-6-diethylamino-1,3,5-triazine, 4,6-diamino-2-vinyl-1,3,5- triazine, 2,4,6-tris[bis(methoxymethyl)amino]-1,3,5-triazine, 2,4-diamino-6-diallylamino-1,3,5-triazine, 2,4-diamino-6-butylamino-1,3,5-triazine, 2,4-diamino-6-(cyclopropylamino)-1,3,5-triazine, and 2,4-diamino-6-phenyl-1,3,5-triazine.

The heteroaromatic compound (C) is 4-methylpyrimidine, 3-aminopyridine, 2-amino-4,6-dimethylpyrimidine, 2,4-diamino-6-methyl-1,3,5-triazine, or 4-dimethylaminopyridine to restrain side etching further with more sufficient restraint of lowering in the linearity of copper wiring.

The heteroaromatic compound (C) is preferably a heteroaromatic compound (c1) further including a five-membered heteroaromatic ring having one or more nitrogen atoms as one or more heteroatoms constituting the ring since this compound produces a high advantageous effect of restraining side etching effectively without lowering the linearity of copper wiring.

It is sufficient for each of the six-membered heteroaromatic ring and the five-membered heteroaromatic ring to have one or more nitrogen atoms as one or more heteroatoms. Thus, these rings may each have a heteroatom other than nitrogen. Each of the six-membered heteroaromatic ring and the five-membered heteroaromatic ring is preferably a ring having, as its heteroatom(s), one or more nitrogen atoms, or having, as it heteroatoms, only nitrogen and sulfur atoms in order to effectively restrain side etching without lowering the linearity of copper wiring. Each of the six-membered heteroaromatic ring and the five-membered heteroaromatic ring may be substituted with a substituent, such as an amino, alkyl, aralkyl, aryl, nitro, nitroso, hydroxyl, carboxyl, aldehyde, alkoxy, halogen, azo, cyano, imino, phosphino, thiol, or sulfo group or radical.

The heteroaromatic compound which includes the six-membered heteroaromatic ring and the five-membered heteroaromatic ring may be a heteroaromatic compound in which the six-membered heteroaromatic ring is condensed with the five-membered heteroaromatic ring to form a condensed ring (hereinafter, this compound may be referred to as the heteroaromatic compound (c1-1)), this compound being, for example, adenine represented by the following formula (XI):

[Formula]

(XI)

or a heteroaromatic compound in which the six-membered heteroaromatic ring is linked with the five-membered heteroaromatic ring through a single bond or a bivalent linking group (hereinafter, this compound may be referred to as the heteroaromatic compound (c1-2)).

However, the following is excluded from the heteroaromatic compounds usable in the present invention: any cyclic compound including, as an atom constituting its heterocycle, carbon in a carbonyl group, this compound being, for example, guanine represented by the following formula (XII):

[Formula]

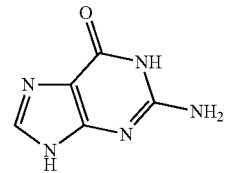

(XII)

The heteroaromatic compound (c1-2) in which the six-membered heteroaromatic ring is linked with the five-membered heteroaromatic ring through a single bond is, for example, 2-(4-pyridyl)benzimidazole, which is represented by the following formula (XIII):

[Formula]

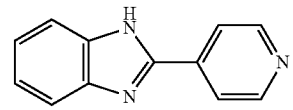

(XIII)

The heteroaromatic compound (c1-2) in which the six-membered heteroaromatic ring is linked with the five-membered heteroaromatic ring through a bivalent linking group is, for example, 2,4-diamino-6-[2-(2-methyl-1-imidazolyl)ethyl]-1,3,5-triazine, which is represented by the following formula (XIV):

[Formula]

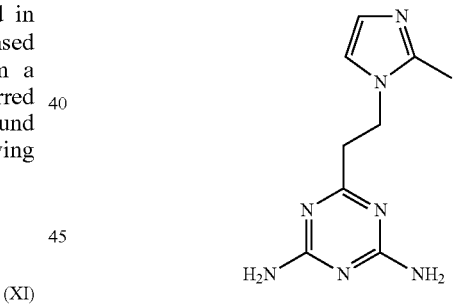

(XIV)

Examples of the bivalent linking group include bivalent hydrocarbon derivation groups, —O—, and —S—. The hydrocarbon derivation groups each denote a hydrocarbon group in which carbon or hydrogen atoms may be partially substituted with one or more other atoms or one or more substituents.

Each of the bivalent hydrocarbon derivation groups may be, besides any alkylene group, any alkenylene group or alkynylene group. The number of carbon atoms in the bivalent hydrocarbon derivation group is not particularly limited, and is preferably from 1 to 6, more preferably from 1 to 3 from the viewpoint of the solubility of the heteroaromatic compound.

A specific example of a compound having respective structural characteristics of the heteroaromatic compound (c1-1) and the heteroaromatic compound (c1-2) is azathioprine.

Specific examples of the heteroaromatic compound (c1) include adenine, 6-benzyladenine, adenosine, 2-aminoadenosine, 2-(4-pyridyl)benzimidazole, 2,4-diamino-6-[2-(2-methyl-1-imidazolyl)ethyl]-1,3,5-triazine, 3-(1-pyrrolylmethyl)pyridine, 1H-pyrrolo[2,3-b]pyridine, 2,6-bis(2-benzimidazolyl)pyridine, imidazo[1,2-b]pyridazine, purine, 6-chloropurine, 6-chloro-7-deazapurine, azathioprine, 6-(dimethylamino)purine, 7-hydroxy-5-methy-1,3,4-triazaindolizine, imidazo[1,5-a]pyridine-3-carboxyaldehyde, 6-mercaptopurine, 6-methoxypurine, 1H-1,2,3-triazolo[4,5-b]pyridine, thiamine, 1H-pyrrolo[2,3-c]pyridine, 1H-pyrrolo[3,2-c]pyridine, 1H-pyrrolo[3,2-b]pyridine, 7-methyl-1H-pyrrolo[2,3-c]pyridine, 6-chloro-3-[(4-methyl-1-piperazinyl)methyl]-1H-pyrrolo[3,2-c]pyridine, 2-methyl-1H-pyrrolo[2,3-b]pyridine, 3-(piperidinomethyl)-1H-pyrrolo[2,3-b]pyridine, 3-(1-methyl-1H-pyrrole-2-yl) pyridine, 1-methyl-2-(3-pyridinyl)-1H-pyrrole, 3-(2-pyrrolyl)pyridine, 2-(1-pyrrolyl)pyridine, 3H-imidazo[4,5-c]pyridine, 1-(2-phenylethyl)-1H-imidazo[4,5-c]pyridine, 2-azaindolizine, 2-phenyl-1H-imidazo[4,5-b]pyridine, 3-(3-pyridinyl)-1H-1,2,4-triazole, 7-methyl-1,2,4-triazolo[4,3-a] pyridine, [1,2,4]triazolo[1,5-a]pyridine-6-amine, 3-nitro-5-(3-pyridyl)-1H-pyrazole, 1-(2-pyridyl)-1H-pyrazole-4-amine, 2,3-dimethylpyrazolo[1,5-a]pyridine, 2,3,7-trimethylpyrazolo[1,5-a]pyridine, 8-amino-2-phenyl[1,2,4] triazolo[1,5-a]pyridine, 5-(2-pyridyl)-2H-tetrazole, 2-(2-pyridyl)benzothiazole, 2-(2-pyridyl)-4-thiazoleacetic acid, 4-(benzylamino)-2-methyl-7H-pyrrolo[2,3-d]pyrimidine, 7-deazaadenine, 5,7-dimethylpyrazolo[1,5-a]pyrimidine, 2,5-dimethylpyrazolo[1,5-a]pyrimidine-7-amine, 4-amino-1H-pyrazolo[3,4-d]pyrimidine, 1H-pyrazolo[4,3-d]pyrimidine-7-amine, 4-[(3-methyl-2-butenyl)amino]-1H-pyrazolo[3,4-d]pyrimidine, 4H-pyrazolo[3,4-d]pyrimidine-4-amine, imidazo[1,2-a]pyrimidine, 5,7-dimethyl[1,2,4]triazole[1,5-a]pyrimidine, 8-tert-butyl-7,8-dihydro-5-methyl-6H-pyrrolo[3,2-e][1,2,4]triazolo[1,5-a]pyrimidine, 5,7-diamino-1H-1,2,3-triazolo[4,5-d]pyrimidine, 8-azapurine, 5-amino-2-(methylthio)triazolo[5,4-d]pyrimidine, 2,5,7-trichlorothiazolo[5,4-d]pyrimidine, 6-chloro-2-[4-(methylsulfonyl)phenyl]imidazo[1,2-b]pyridazine, 2-methylimidazo[1,2-b]pyridazine, 1H-imidazo[4,5-d] pyridazine, 1,2,4-triazolo[4,3-b]pyridazine, 6-chloro-1,2,4-triazolo[4,3-b]pyridazine, 6-methyl-1,2,4-triazolo[4,3-b] pyridazine, 6,7-dimethyl-1,2,4-triazolo[4,3-b]pyridazine, tetrazolo[1,5-b]pyridazine, 6-chlorotetrazolo[1,5-b] pyridazine, 8-methyltetrazolo[1,5-b]pyridazine, 6-chloro-7-methyltatrazolo[1,5-b]pyridazine, 6-methoxytetrazolo[1,5-b]pyridazine, tetrazolo[1,5-b]pyridazine-6-amine, 7-methylpyrazolo[1,5-a]-1,3,5-triazine-2,4-diamine, pyrazolo[5,1-c][1,2,4]benzotriazine-8-ol, 6,7-dimethylpyrazolo[5,1-c][1,2,4]triazine-2(6H)-amine, 4,6-dihydro-3,4-dimethylpyrazolo[5,1-c][1,2,4]triazine, 3-hydrazino-7-methyl-5-phenyl-5H-pyrazolo[3,4-e]-1,2,4-triazine, imidazo[5,1-f] [1,2,4]triazine-2,7-diamine, 4,5-dimethylimidazo[5,1-f][1,2,4]triazine-2,7-diamine, 2-azaadenine, 7,8-dihydro-5-methylimidazo[1,2-a][1,2,4]triazole[1,5-c][1,3,5]triazine, 7,8-dihydroimidazo[1,2-a][1,2,4]triazolo[1,5-c][1,3,5]triazine, 1,2,4-triazolo[4,3-a][1,3,5]triazine-3,5,7-triamine, 5-azaadenine, and 7,8-dihydroimidazo[1,2-a][1,2,4]triazolo[1,5-c][1,3,5]triazine. The heteroaromatic compound may be in a hydrochloride form of this compound, or in a sulfate form thereof, or may be in a hydrate form thereof. One or more of heteroaromatic compounds (c1) as described above may be blended in the etchant of the present invention.

The above-mentioned heteroaromatic compound (c1) is preferably adenine, which is represented by the above-mentioned formula (XI), or thiamine hydrochloride represented by the following formula (XV):

[Formula]

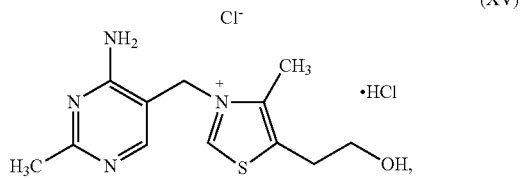

to restrain side etching further with more sufficient restraint of lowering in the linearity of copper wiring.

The concentration of the compound (s) selected from the group consisting of the aliphatic noncyclic compound, the aliphatic heterocyclic compound and the heteroaromatic compound preferably ranges from 0.01 to 100 g/L, more preferably from 0.02 to 80 g/L, even more preferably from 0.05 to 30 g/L to restrain side etching and further improve the linearity of copper wiring.

Besides the above-mentioned components, any other component may be added to the etchant of the present invention at such a level that the advantageous effects of the present invention are not hindered. For example, a surfactant, a component stabilizer or an antifoaming agent may be added thereto. When the other component is added, the concentration thereof is from about 0.001 to 5 g/L.

The etchant can easily be prepared by dissolving the above-mentioned individual components in water. The water is preferably water from which ionic substances and impurities have been removed. Examples thereof include ion exchange water, pure water, and ultrapure water.

About the etchant, it is allowable to blend each of the components to give a predetermined concentration when the etchant is used, or prepare a concentrated liquid of the etchant and use a diluted liquid obtained by diluting this concentrated liquid just before the etchant is used. The manner of using the etchant is not particularly limited. In order to restrain side etching effectively, it is preferred to use a spray to perform etching, as will be later detailed. The temperature of the etchant when the etchant is used is not particularly limited. This temperature is preferably from 20 to 60° C. to maintain the productivity at a high level and further restrain side etching effectively.

The replenishment solution of the present invention is a replenishment solution to be added to the etchant of the invention when the etchant is continuously or repeatedly used, and is an aqueous solution including one or more compounds selected from the group consisting of the above-defined aliphatic noncyclic compound, aliphatic heterocyclic compound and heteroaromatic compound. Individual components of this replenishment solution are the same components as can be blended in the etchant of the invention. By the addition of the replenishment solution, the ratio among the individual components of the etchant is properly kept, so that the above-mentioned advantageous effects of the etchant of the present invention can stably be maintained.

The replenishment solution of the present invention may include an acid such as hydrochloric acid in a concentration not more than 360 g/L. The replenishment solution may include a cupric ion source, such as cupric chloride, in a concentration not more than 14 g/L, this concentration being a concentration in terms of cupric ion. The replenishment solution may include a bromide ion source, such as sodium bromide, in a concentration not more than 800 g/L, this concentration being a concentration in terms of bromide ion. Besides the above-mentioned components, the components to be added to the etchant may be blended in the replenishment solution. These components, which may be included in the replenishment solution, may be directly added, without being incorporated into the replenishment solution, to the etchant of the invention when the etchant is continuously or repeatedly used.

The concentration of each of the components in the replenishment solution is appropriately set in accordance with the concentration of the component in the etchant. The concentration of the one or more compounds selected from the aliphatic noncyclic compound, aliphatic heterocyclic compound, and heteroaromatic compound is preferably from 0.05 to 800 g/L to maintain the advantageous effects of the etchant of the present invention stably.

The copper wiring forming method of the present invention is a method for forming copper wiring by etching a portion of a copper layer that is uncovered with an etching resist, wherein the etching is performed using the etchant of the present invention. This method makes it possible to restrain side etching without lowering the linearity of the copper wiring, as described above, and further restrain the wiring width (W1) of the bottom of the copper wiring from being varied. In the case of using the etchant of the invention continuously or repeatedly in a copper wiring forming step in which the copper wiring forming method of the invention is adopted, it is preferred to perform etching while the replenishment solution of the invention is added to the etchant. In this case, the ratio among the individual components of the etchant is properly kept so that the advantageous effects of the etchant of the invention can stably be maintained.

In the copper wiring forming method of the present invention, it is preferred to spray the etchant onto the portion of the copper layer, which is uncovered with the etching resist, using a spray. This case makes it possible to restrain side etching effectively. When the etchant is sprayed, a nozzle therefor is not particularly limited. The nozzle may be, for example, a fan-shaped nozzle, a full-cone nozzle, or a two-fluid nozzle.

When the spray is used to perform the etching, the spray pressure is preferably 0.04 MPa or more, more preferably 0.08 MPa or more. When the spray pressure is 0.04 MPa or more, a protective coat can be formed in an appropriate thickness on any side surface of the copper wiring. In this way, side etching can be effectively prevented. The spray pressure is preferably 0.30 MPa or less to prevent a damage of the etching resist.

EXAMPLES

The following will describe working examples of the present invention together with comparative examples. The invention should not be interpreted to be limited to the working examples.

Each etchant was prepared which had a composition shown in Tables 1 and 2. The etchant was used to perform etching under conditions described later. The etchant was evaluated about an item according to each evaluation method described later. In the etchant, which had any one of the compositions shown in Tables 1 and 2, the balance was ion exchange water. Each hydrochloric acid concentration shown in Tables 1 and 2 is a concentration in terms of hydrogen chloride.

Each Used Test Substrate:

Prepared was a copper clad laminate in which an electrolytic copper foil piece (trade name: 3EC-III, manufactured by Mitsui Mining & Smelting Co., Ltd.) having a thickness of 12 μm was laminated. This copper foil piece was treated with a palladium catalyst-containing treatment liquid (trade name: Ad Copper Series, manufactured by Okuno Chemical Industries Co., Ltd.), and then an electroless plating film was formed thereon using an electroless plating liquid (trade name: Ad Copper Series, manufactured by Okuno Chemical Industries Co., Ltd.). Next, an electrolytic plating liquid (trade name: Top Lucina SF, manufactured by Okuno Chemical Industries Co., Ltd.) was used to form an electrolytic copper film having a thickness of 10 μm on the electroless copper plating film to adjust the total thickness of the copper layer to 22.5 μm. The outer surface of the resultant electrolytic copper plating film was covered with a dry film resist having a thickness of 25 μm. Thereafter, a glass mask in which the line/space widths (L/S)=36 μm/24 μm was used to expose the resultant to light. The resultant was subjected to developing treatment to remove its unexposed portion. In this way, an etching resist pattern was produced in which the L/S=36 μm/24 μm.

Etching Conditions:

A fan-shaped nozzle (trade name: ISVV 9020, manufactured by H. IKEUCHI Co., Ltd.) was used to etch the resultant test substrates under conditions of a spray pressure of 0.20 MPa and a treatment temperature of 45° C. The etching period was set to a target period permitting the wiring width (W1) of each of the copper wiring bottoms after the etching to reach 30 μm. After the etching, the test substrates were washed with water, dried, and evaluated as described below.

Side Etching Quantity:

Some of the test substrates that were etched with the respective etchants were each immersed in a 3% by weight sodium hydroxide solution in water, the temperature of which was 50° C., for 60 seconds to remove the etching resist. Thereafter, hydrochloric acid (hydrogen chloride concentration: 7% by weight) was used and sprayed onto the test substrate through a fan-shaped nozzle (trade name: ISVV 9020, manufactured by H. IKEUCHI Co., Ltd.) at a spray pressure of 0.12 MPa and a treatment temperature of 30° C. for a treating period of 10 seconds to remove the protective coat. A portion of the test substrate was cut off, and this portion was embedded in a cold-embedding polyester resin, and the resin was polished to make cross sections of the copper wires of the test substrate observable. An optical microscope was used to observe the cross sections at 200-fold magnification. The wiring width (W2) of the copper wiring tops was then measured. The difference between W2 and the wiring width (W1) of the copper wiring bottoms (W1−W2) was defined as the side etching quantity (μm) of the test substrate (see FIG. 1). The results are shown in Tables 1 and 2. The side etching quantity is preferably 10 μm or less, more preferably 7 μm or less.

Top Width Linearity:

In the same way as used to evaluate the side etching quantity, from some of the test substrates that were etched with the respective etchants, their etching resist was removed to remove their protective coat. An optical microscope was used to observe the upper surface of each of these test substrates at 200-fold magnification. The respective wiring widths (W2) of the copper wiring tops were measured at 40 sites of eight of the entire wiring lines, i.e., 5 sites of each of the eight wiring lines, at site intervals of 40 μm. The standard deviation thereof was defined as the top width linearity (μm) of the test substrate. The results are shown in Tables 1 and 2. The top width linearity is preferably 1.0 μm or less, more preferably 0.7 μm or less.

Bottom Width Variation:

In the same way as used to evaluate the side etching quantity, from some of the test substrates that were etched with the respective etchants, their etching resist was removed to remove their protective coat. An optical microscope was used to observe the upper surface of each of these test substrates at 200-fold magnification. The respective wiring widths (W1) of the copper wiring bottoms were measured at 40 sites of eight of the entire wiring lines, i.e., 5 sites of each of the eight wiring lines, at site intervals of 40 μm. The standard deviation thereof was defined as the bottom width variation (μm) of the test substrate. The bottom width variation is preferably 1.5 μm or less, more preferably 1.2 μm or less.

TABLE 1

| | Composition | Blend amount | Processing period [seconds] | Side etching quantity [μm] | Linearity [μm] | Bottom width variation [μm] |
|---|---|---|---|---|---|---|
| Example 1 | Cupric chloride dihydrate | 341 g/L (127 g/L in terms of cupric ion) | 148.6 | 5.2 | 0.69 | 1.14 |
| | Hydrochloric acid | 72 g/L | | | | |
| | Hydrobromic acid | 56 g/L (55 g/L in terms of bromide ion) | | | | |
| | Thiamine hydrochloride | 2 g/L | | | | |
| Example 2 | Cupric chloride dihydrate | 341 g/L (127 g/L in terms of cupric ion) | 151.0 | 5.4 | 0.50 | 0.83 |
| | Hydrochloric acid | 72 g/L | | | | |
| | Hydrobromic acid | 56 g/L (55 g/L in terms of bromide ion) | | | | |
| | Triethylenetetramine | 1 g/L | | | | |
| Example 3 | Cupric chloride dihydrate | 341 g/L (127 g/L in terms of cupric ion) | 165.2 | 6.4 | 0.32 | 0.99 |
| | Hydrochloric acid | 72 g/L | | | | |
| | Hydrobromic acid | 56 g/L (55 g/L in terms of bromide ion) | | | | |
| | 4-Methylpyrimidine | 2 g/L | | | | |
| Example 4 | Ferric chloride | 200 g/L (68 g/L in terms of ferric ion) | 107.7 | 9.9 | 0.31 | 1.21 |
| | Hydrochloric acid | 10 g/L | | | | |
| | Hydrobromic acid | 56 g/L (55 g/L in terms of bromide ion) | | | | |
| | Thiamine hydrochloride | 2 g/L | | | | |
| Example 5 | Cupric chloride dihydrate | 341 g/L (127 g/L in terms of cupric ion) | 140.8 | 5.0 | 0.45 | 0.92 |
| | Hydrochloric acid | 72 g/L | | | | |
| | Sodium bromide | 103 g/L (80 g/L in terms of bromide ion) | | | | |
| | Thiamine hydrochloride | 2 g/L | | | | |
| Example 6 | Cupric chloride dihydrate | 512 g/L (190 g/L in terms of cupric ion) | 138.5 | 6.7 | 0.55 | 1.04 |
| | Hydrochloric acid | 72 g/L | | | | |
| | Potassium bromide | 83 g/L (55 g/L in terms of bromide ion) | | | | |
| | 1-Methylpiperazine | 1 g/L | | | | |
| Example 7 | Cupric chloride dihydrate | 341 g/L (127 g/L in terms of cupric ion) | 114.5 | 6.5 | 0.42 | 0.87 |
| | Hydrochloric acid | 72 g/L | | | | |
| | Hydrobromic acid | 16 g/L (16 g/L in terms of bromide ion) | | | | |
| | Thiamine hydrochloride | 2 g/L | | | | |

TABLE 2

| | Composition | Blend amount | Processing period [seconds] | Side etching quantity [μm] | Linearity [μm] | Bottom width variation [μm] |
|---|---|---|---|---|---|---|
| Comparative Example 1 | Cupric chloride dihydrate | 341 g/L (127 g/L in terms of cupric ion) | 221.8 | 10.7 | 0.61 | 1.85 |
| | Hydrochloric acid | 72 g/L | | | | |
| | Hydrobromic acid | 56 g/L (55 g/L in terms of bromide ion) | | | | |
| Comparative Example 2 | Cupric chloride dihydrate | 341 g/L (127 g/L in terms of cupric ion) | 141.2 | 12.9 | 0.40 | 1.57 |
| | Hydrochloric acid | 72 g/L | | | | |

TABLE 2-continued

|  | Composition | Blend amount | Processing period [seconds] | Side etching quantity [μm] | Linearity [μm] | Bottom width variation [μm] |
|---|---|---|---|---|---|---|
| Comparative Example 3 | Cupric chloride dihydrate | 341 g/L (127 g/L in terms of cupric ion) | 135.2 | 8.1 | 0.44 | 1.30 |
|  | Hydrochloric acid | 72 g/L |  |  |  |  |
|  | Thiamine hydrochloride | 2 g/L |  |  |  |  |
| Comparative Example 4 | Cupric chloride dihydrate | 341 g/L (127 g/L in terms of cupric ion) | 118.4 | 10.8 | 0.31 | 1.52 |
|  | Hydrochloric acid | 72 g/L |  |  |  |  |
|  | Thiamine hydrochloride | 2 g/L |  |  |  |  |
|  | Sodium chloride | 88 g/L (53 g/L in terms of chloride ion) |  |  |  |  |
| Comparative Example 5 | Ferric chloride | 200 g/L (68 g/L in terms of ferric ion) | 102.5 | 14.4 | 0.35 | 1.71 |
|  | Hydrochloric acid | 10 g/L |  |  |  |  |
| Comparative Example 6 | Cupric chloride dihydrate | 341 g/L (127 g/L in terms of cupric ion) | 247.5 | 9.0 | 1.18 | 1.56 |
|  | Hydrochloric acid | 72 g/L |  |  |  |  |
|  | Hydrobromic acid | 56 g/L (55 g/L in terms of bromide ion) |  |  |  |  |
|  | 5-Aminotetrazole | 0.5 g/L |  |  |  |  |

As shown in Table 1, the working examples of the present invention each gave a good result about any one of the evaluation items. In the meantime, as shown in Table 2, the comparative examples each gave a poorer result about one or more of the evaluation items than the working examples. From these results, it has been understood that the present invention makes it possible to restrain side etching without lowering the linearity of copper wiring, and further restrain the wiring width (W1) of the bottom of the copper wiring from being varied.

What is claimed is:

1. An etchant for copper,
the etchant being an aqueous solution comprising an acid, an oxidizing metal ion, a bromide ion, and
one or more compounds selected from the group consisting of an aliphatic noncyclic compound, an aliphatic heterocyclic compound and a heteroaromatic compound,
wherein the aliphatic noncyclic compound is a saturated aliphatic noncyclic compound (A) comprising only two or more nitrogen atoms as heteroatoms, and 2 to 10 carbon atoms,
the aliphatic heterocyclic compound is an aliphatic heterocyclic compound (B) comprising a five-, six-, or seven-membered ring having one or more nitrogen atoms as one or more heteroatoms constituting the ring, and
the heteroaromatic compound is a heteroaromatic compound (C) comprising a six-membered heteroaromatic ring having one or more nitrogen atoms as one or more heteroatoms constituting the ring,
wherein a concentration of the oxidizing metal ion is from 68 to 300 g/L, and a concentration of the bromide ion is from 10 to 150 g/L.

2. The etchant according to claim 1, wherein the acid is hydrochloric acid.

3. The etchant according to claim 1, wherein the oxidizing metal ion is a cupric ion.

4. The etchant according to claim 1, wherein at least one terminal group of the aliphatic noncyclic compound (A) is an NH$_2$ group.

5. The etchant according to claim 1, wherein the aliphatic heterocyclic compound (B) is an aliphatic heterocyclic compound (b1) comprising a five-, six-, or seven-membered ring having only one or more nitrogen atoms as one or more heteroatoms constituting the ring.

6. The etchant according claim 1, wherein the heteroaromatic compound (C) is a heteroaromatic compound (c1) further comprising a five-membered heteroaromatic ring having one or more nitrogen atoms as one or more heteroatoms constituting the ring.

7. The etchant according to claim 6, wherein the heteroaromatic compound (c1) is a heteroaromatic compound (c1-1) in which the six-membered heteroaromatic ring and the five-membered heteroaromatic ring are condensed with each other to form a condensed ring, and/or a heteroaromatic compound (c1-2) in which the six-membered heteroaromatic ring and the five-membered heteroaromatic ring are linked with each other through a single bond or a bivalent linking group.

8. The etchant according to claim 1, further comprising a replenishment solution which is continuously or repeatedly added to the etchant at the time of using the etchant,
the replenishment solution being an aqueous solution comprising one or more compounds selected from the group consisting of an aliphatic noncyclic compound, an aliphatic heterocyclic compound, and a heteroaromatic compound,
wherein the aliphatic noncyclic compound is a saturated aliphatic noncyclic compound (A) comprising only two or more nitrogen atoms as heteroatoms, and 2 to 10 carbon atoms,
the aliphatic heterocyclic compound is an aliphatic heterocyclic compound (B) comprising a five-, six-, or seven-membered ring having one or more nitrogen atoms as one or more heteroatoms constituting the ring, and
the heteroaromatic compound is a heteroaromatic compound (C) comprising a six-membered heteroaromatic ring having one or more nitrogen atoms as one or more heteroatoms constituting the ring.

9. A method for forming copper wiring by etching a portion of a copper layer that is uncovered with an etching resist, wherein the etching is performed using the etchant according to claim 1.

* * * * *